United States Patent [19]

Littlebury

[11] Patent Number: 4,985,988
[45] Date of Patent: Jan. 22, 1991

[54] METHOD FOR ASSEMBLING, TESTING, AND PACKAGING INTEGRATED CIRCUITS

[75] Inventor: Hugh W. Littlebury, Chandler, Ariz.

[73] Assignee: Motorola, Inc., Schaumburg, Ill.

[21] Appl. No.: 431,353

[22] Filed: Nov. 3, 1989

[51] Int. Cl.⁵ .......................................... H01R 43/00
[52] U.S. Cl. .................... 29/827; 174/52.2.;
  206/328; 206/330; 324/158 R; 437/217;
  437/220
[58] Field of Search .................. 29/827; 437/217, 218,
  437/219, 220; 206/328, 330, 333; 174/52.2;
  365/201; 324/158 R; 357/70, 80

[56] References Cited

U.S. PATENT DOCUMENTS

| | | | |
|---|---|---|---|
| 3,317,287 | 5/1967 | Caraeciolo | 29/827 X |
| 3,793,714 | 2/1974 | Bylander | 437/220 |
| 3,859,718 | 1/1975 | Noe | 174/52.2 X |
| 4,180,161 | 12/1979 | Henrickson et al. | 206/328 |
| 4,214,364 | 7/1980 | St. Louis et al. | 29/827 |
| 4,246,697 | 1/1981 | Smith | 29/827 |
| 4,330,790 | 5/1982 | Burns | 29/827 |
| 4,552,267 | 11/1985 | Layher | 206/330 X |
| 4,655,364 | 4/1987 | Swapp et al. | 206/328 X |
| 4,701,781 | 10/1987 | Sankhagowit | 174/52.2 X |
| 4,736,520 | 4/1988 | Morris | 29/827 |
| 4,799,021 | 1/1989 | Cozzi | 324/158 RX |

Primary Examiner—P. W. Echols
Assistant Examiner—Carl J. Arbes
Attorney, Agent, or Firm—Joe E. Barbee; Stuart T. Langley

[57] ABSTRACT

An assembly flow in which integrated circuits are burned-in and parametrically tested before assembly is provided. The integrated circuits are sorted based on the results of the parametric testing, and assembled in groups with similar parameters. Integrated circuits from a single group are assembled on a leadframe and encapsulated, marked, and tested again while still attached to the leadframe. Finally, the packaged integrated circuits are separated from the leadframe and those meeting predetermined parameters are loaded into carrier sleeves.

11 Claims, 1 Drawing Sheet

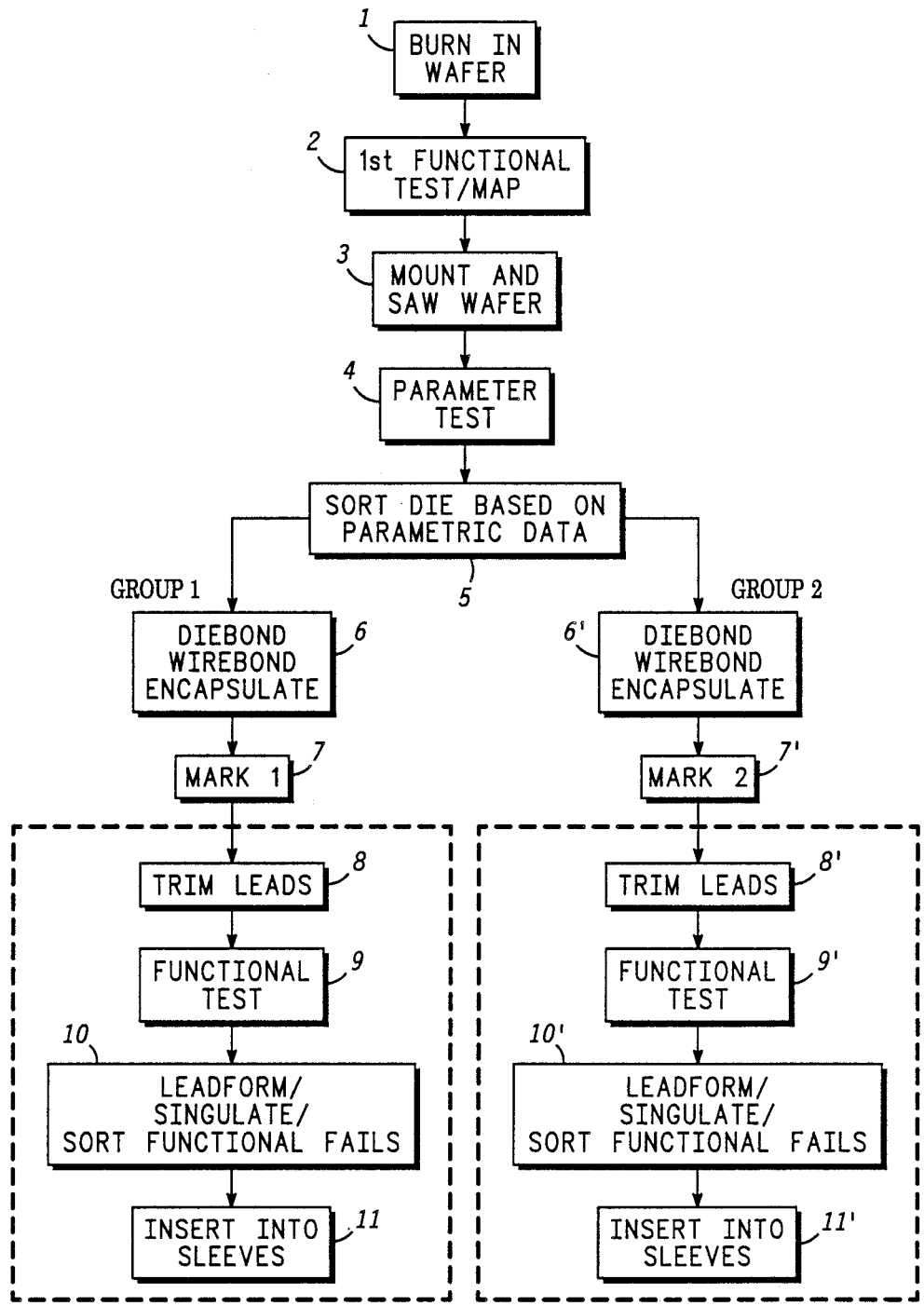

METHOD FOR ASSEMBLING, TESTING, AND PACKAGING INTEGRATED CIRCUITS

BACKGROUND OF THE INVENTION

This invention relates, in general, to integrated circuit assembly and testing, and more particularly, to a batch process for assembly and test of integrated circuits.

A significant portion of the cost of integrated circuits (ICs) is incurred in packaging and testing. This is because packaging and testing are labor intensive operations which require repeated handling of individual packaged integrated circuits. Conventionally, good and bad ICs are mixed together during packaging. The packaged ICs are then burned-in and tested to remove the bad circuits. At this point, however, most of the cost of assembly and test has been incurred and so the rejected ICs are quite expensive.

Commonly, a batch of semiconductor devices are sorted into groups which have similar parameters. These groups or categories make up a particular device type, and are selected to meet a customer specification or an industry standard specification. Semiconductor memories in particular must be tested and sorted according to operating speed before shipping to a customer. In the past, this sorting was done after packaging, burn in, and parametric testing. While sorting does not usually produce a high number of rejects, performing sorting at this late step in the packaging/test process makes it difficult for a manufacturer to predict what particular device types will be available to sell. This lack of predictability makes production control difficult and results in product shipment delays to customers. Indeed, if no demand exists for a particular device type, packaged ICs which meet only the unwanted device type parameters must be scrapped or warehoused, which are both expensive options.

In addition to the cost incurred by packaging rejected and unwanted integrated circuits, additional cost is incurred because of damage induced by handling the individual packaged ICs. The mechanical operations involved in handling a packaged integrated circuit are complex. Damage to the package, or to leads which extend from the package, commonly occurs during burn-in, test, and package mark. The damage is usually caused by handling the individual packages, not by the operations themselves. Damage which occurs at these stages is usually not repairable and so good devices are scrapped.

In addition to the added yield loss, equipment used to handle packaged integrated circuits is usually expensive, and must be replicated for each operation. Thus, duplicate handling equipment must be provided for burn in, test, and mark. This equipment uses up a large amount of factory floor space, further increasing the overhead cost of assembly and test. Because handling equipment is mechanically complex, maintenance cost is usually high.

Accordingly it is an object of the present invention to provide an assembly and test flow for integrated circuits which significantly reduces the number of process steps.

A further object of the present invention is to provide an assembly and test flow for integrated circuits which allows manufacturers to evaluate parametric data before packaging the circuits.

It is another object of the present invention to provide an assembly and test flow for integrated circuits which improves cycle time.

It is another object of present invention to provide an assembly test flow which reduces equipment cost and floor space.

Another object of the present invention is to provide an assembly test flow for integrated circuits which improves quality.

Another object of the present invention is to provide an assembly test flow for integrated circuits which reduces the assembly and test costs added to those circuits.

SUMMARY OF THE INVENTION

These and other objects and advantages of the present invention are achieved by an assembly flow in which burn-in and parametric test of integrated circuits is done before assembly. The integrated circuits are sorted based on the results of the parametric testing, and assembled in groups with similar parameters. Integrated circuits from a single group are assembled on a leadframe and encapsulated, marked, and tested again while still attached to the leadframe. Finally, the encapsulated integrated circuits are separated from the leadframe and loaded into carrier sleeves.

BRIEF DESCRIPTION OF THE DRAWINGS

The single figure illustrates a flow chart of the assembly and test flow of the present invention.

DETAILED DESCRIPTION OF THE DRAWING

The single figure illustrates a simplified assembly and test flow of the present invention. The assembly and test process begins with whole semiconductor wafers which have completed front-end processing. Front-end processing comprises diffusion, photolithography, and metallization processes, while back-end processing refers to packaging, testing, and burning-in the integrated circuits. A first step in the assembly process is burn-in 1 of the integrated circuits. Burn-in is accomplished in wafer form by coupling all of the integrated circuits on a wafer in parallel with each other and to an external exercising circuit. A fixture used to burn-in integrated circuits in wafer form is described in another application filed on the same day as the present application by the same inventor. The exercising circuit is similar to that used for conventional packaged circuit burn-in and is merely a circuit which powers the integrated circuits, and applies test vectors to activate selected portions of the integrated circuit. Usually, the integrated circuits are burned-in at temperatures of approximately 100° C. for 72 or more hours. Burn-in 1 will result in degradation and catastrophic failures of some of the integrated circuits.

Preferably, during burn-in 1 the ICs are functionally tested for a first time as indicated by box 2 in the figure. A failure map is produced to record the location of devices which failed during burn-in 1. First functional test 2 can be performed after burn-in 1, but it is highly desirable to perform it at the same time to guarantee that all ICs on the wafer are properly coupled to the exercising circuit. If proper contact has not been made to an IC, burn-in 1 will not be performed. In this case, though, the improperly contacted IC will fail functional test 2 and be rejected. In this manner, any ICs which are not properly burned-in will not be packaged or shipped to a customer. Although the ICs will be tested again later in the assembly process before packaging, only functional test 2, when performed during burn-in, can ensure that burn-in has actually been performed.

A mount and saw process 3 is the next step after the first functional test 2 is done. The wafers are mounted on a supporting film and sawed to separate the individual integrated circuits from each other. Usually, an adhesive tape is used for the supporting film. Once the wafer is sawed, the adhesive tape is expanded, or stretched, to electrically separate the individual integrated circuits.

Parametric test 4 is now performed. It should be noted that parametric test 4 can be performed optionally before or after mount and saw operation 3. Parametric testing 4 is different from functional testing 2 in that parametric testing 4 measures important parameters such as operating speed. In contrast, functional testing 2 merely tests whether or not the IC is functional, without measuring whether or not the IC meets parameter specifications. Parametric testing 4 can be done one circuit at a time or several integrated circuits in parallel, but it is important that it be done before packaging. Because the integrated circuits must be tested at their operating speed, it is important that the parametric test circuit provide a test head for contacting the integrated circuit such that high speed signals can be propagated to and from the integrated circuit. One way of doing this is to provide a membrane test head which has a plurality of probe bumps formed on one side coupled to microstrip transmission lines formed on the other. Using a membrane probe head, high quality signal lines are formed right up to contact pads on the integrated circuit. A fixture used parametric testing of integrated circuits in wafer form is described in another application filed on the same day and having the same inventor as the present application.

Parametric data is recorded for each integrated circuit on the wafer and stored so that a particular set of data is associated with each location of the wafer. Likewise, functional test data is stored for each location on the wafer if this has not been done earlier. In this case, die which passed the functional test 2 are removed from the adhesive support and placed in a carrier tray. Only the integrated circuits in the carrier tray then go to parametric testing 4. This method offers the advantage of reducing parametric test time by removing chips which will fail parametric testing 4 because they are non-functional before parametric testing begins. Since parametric testing 4 takes considerably longer than functional testing 2, time savings will often be significant.

After parametric test 4, a parametric data sort 5 is done so that integrated circuits with similar parameters can be grouped together. In the case of semiconductor memories, groups will be chosen based on operating speed parameter data and the single wafer or carrier tray may have three or four different categories or groups of integrated circuits. It is not necessary that the integrated circuits in the same group be located next to or near each other on the wafer or carrier tray, since location data is recorded and associated with each set of parameter data. The figure illustrates group one and group two which are separated based on the sorting of the parametric data, although it should be understood that any number of groups may be formed during data sort 5.

Packaging process 6 and 6' for group one and group two are similar since the integrated circuits themselves are similar except for parameter differences. Integrated circuits from each group are selected from the wafer and placed on leadframes so that each leadframe contains integrated circuits from only one group. As long as the groups are chosen so that each group represents a finished part type and meets the parametric specifications for the part type, each leadframe will contain only a single part type. Of course, care must be taken to avoid mixing the different leadframes together during subsequent process steps. After the ICs are bonded to the leadframe, wire bonds are formed coupling contact pads on the integrated circuit to leads on the leadframe. After wire bond, integrated circuits and a portion of the leads are encapsulated, preferably in plastic. As long as the encapsulated integrated circuits are attached to the leadframe, they are protected from lead and package damage. This is because the leads are firmly mechanically supported by the leadframe, and the leadframe can be moved from packaging process 6 and 6' to subsequent processes without directly contacting either the leads or the package itself. Thus, processing while the package is attached to the leadframe induces little damage as compared to processing after the package is separated from the leadframe.

While the packaged integrated circuits are still attached to the leadframe, the packages are marked with an indication of the manufacturers part type and other information, indicated by process steps 7 and 7' in the figure. Marking 7 and 7' will be specific for each group marked so that the mark for group one is different from the mark for group two. Since all of the integrated circuits on a leadframe have been selected to have similar parameters, and to meet specifications for a given part type, this specific information can be marked before the devices are separated from a leadframe. Thus, marking 7 and 7' can be accomplished without expensive handling equipment for individual integrated circuits, and without the risk of damaging the leads or the package because the package is still firmly attached to the leadframe.

After marking 7 and 7', all of the groups have the same processing, and so subsequent processing will be discussed with reference to group one only. The leads which extend from the package body are trimmed at trim operation 8 so that each of the leads is electrically independent of the others. Trim 8 separates the leads from the leadframe; but tie bars which hold the package to the leadframe are not cut. Thus the package remains firmly attached to the leadframe even though the leads themselves are separate from the leadframe. The plastic encapsulation provides mechanical support for the leads to protect them from being bent or torn.

Once the leads are electrically isolated from each other, the integrated circuits can be functionally tested once again to identify any failures caused by the assembly process. Second functional test 9 is preferably done in the same piece of equipment as trim 8, sort 10, and sleeve insertion 11; operations 8-11 are surrounded by a dashed line in the figure to indicate this relationship. Packaging operations 6 can cause failures to the integrated circuits which must be removed before shipping the devices. Since the die bond, wire bond, and encapsulation processes do not normally effect parametric performance of the devices, only functional test 9 is necessary. It may be desirable, however, to parametrically test the circuits once again at this stage as an additional screen for parametrically insufficient devices.

Functional test 9 can be accomplished by coupling a tester to the electrically isolated leads using a membrane test head. The membrane test head is similar to the membrane probe described in reference to parametric testing 4 in that a series of probe bumps are formed on one side of a membrane and coupled to microstrip transmission lines formed on another side of the membrane. A flexible membrane can be adapted to couple to one or more integrated circuits while they are still attached to the leadframe. A fixture used for functional testing integrated circuits which are attached to a leadframe is described in another application filed on the same day as the present application by the same inventor. Other methods of contacting the packaged integrated circuits for functional test 9 are possible, such as wiping contacts and the like. Data generated by functional test 9 data is stored along with the location of the package integrated circuit from which the data was generated.

Final processing is shown by process blocks 10 and 11 in the figure. After functional test 9 is complete, the leads may be bent into any desired shape to meet a customers specification. After the leads are bent, also called lead forming, the tie bars are cut to remove or singulate the packages from the leadframe. The stored functional test data is then used to remove the functional failures which were detected at the previous functional test. Good devices are then transferred into carrier sleeves or boxes which preferably are the same container which is shipped to the customer. The handling tool which transfers the individual packages into the carrier sleeves is the only handling tool required for the entire assembly and test process, since no further processing steps are required.

By now it should be appreciated that a method for assembling and testing integrated circuits has been provided which greatly reduces the number of processing steps required to package and test the integrated circuits. The assembly flow provided reduces redundant handling of integrated circuit packages, thereby reducing the capital cost, maintenance cost, and floor space of the handling equipment. Also, because the package and leads are protected during back-end processing, damage to leads and packages caused by handling is virtually eliminated. By separating the integrated circuits into groups based on parametric data before assembly, reject or unwanted device types will not incur packaging cost, thus greatly reducing the overall cost of the finished product. Additionally, the streamline assembly flow greatly reduces the labor cost involved in assembly and testing of integrated circuits.

What is claimed is:

1. A method for assembling, testing, and packaging integrated circuits (ICs) comprising the steps of: providing the ICs on a wafer; burning-in the ICs in wafer form; mounting the wafer on a support; separating the ICs from each other so that the ICs remain mounted to the support; parametrically testing the ICs and speed-sorting the ICs; removing the ICs from the support and bonding them to a leadframe, wherein the leadframe comprises a plurality of leads which extend away from each of the ICs; encapsulating each of the ICs and a portion of the leads; marking a part identification on the encapsulated ICs; trimming the plurality of leads to electrically isolate them from each other; functionally testing the encapsulated ICs by coupling a tester to the plurality of leads; separating the encapsulated ICs from the leadframe; and inserting the encapsulated ICs which pass the functional testing into a sleeve.

2. The method of claim 1 further comprising the steps of: recording the results of parametrically testing and speed sorting the ICs; and using the recorded results to group ICs having similar results together on the leadframe.

3. The method of claim 1 further comprising the steps of: lead forming the plurality of leads after functional testing of the encapsulated ICs and before separating the encapsulated ICs from the leadframe.

4. The method of claim 1 wherein the steps of testing the functionality of the ICs and speed sorting the ICs is performed on a single piece of equipment.

5. The method of claim 1 wherein the steps of trimming the plurality of leads to electrically isolate them from each other, functionally testing the encapsulated ICs by coupling a tester to the plurality of leads, and separating the encapsulated ICs from the leadframe are performed in a single piece of equipment.

6. The method of claim 1 wherein the ICs are semiconductor memories.

7. The method of claim 1 wherein the step of encapsulating each of the ICs and a portion of the leadframe is performed by molding plastic around the portion of the leadframe and each of the ICs.

8. A method for assembling, testing, and packaging memory circuits comprising the steps of: parametrically testing the memory circuits in wafer form; sorting the memory circuits into groups having similar parameters based on data from the parametric testing; packaging each group of memory circuits separately; and functionally testing the memory circuits after packaging to remove memory circuits which are damaged during packaging.

9. The method of claim 8 wherein the step of parametrically testing the memory circuit includes the step of measuring operating speed parameters.

10. The method of claim 8 further comprising the step of marking a group identification on each packaged memory circuit.

11. A method for assembling, testing, and packaging memory circuits comprising the steps of: parametrically testing the memory circuits in wafer form; sorting the memory circuits into groups having similar parameters based on data from the parametric testing; packaging each group of memory circuits separately; and functionally testing the memory circuits after packaging to remove memory circuits which are damaged during packaging, wherein a plurality of memory circuits from a single group are coupled together on a leadframe during the packaging step, and are separated from the leadframe after the step of functionally testing the memory circuits.

* * * * *